United States Patent
Dietl et al.

(10) Patent No.: US 7,477,714 B2
(45) Date of Patent: Jan. 13, 2009

(54) PHASE ADJUSTING CIRCUIT FOR MINIMIZED IRREGULARITIES AT PHASE STEPS

(75) Inventors: Markus Dietl, Munich (DE); Sotirios Tambouris, Munich (DE)

(73) Assignee: Texas Instruments Deutschland GmbH, Haggertystrasse (DE)

( * ) Notice: Subject to any disclaimer, the term of this patent is extended or adjusted under 35 U.S.C. 154(b) by 440 days.

(21) Appl. No.: 11/058,464

(22) Filed: Feb. 14, 2005

(65) Prior Publication Data

US 2005/0271178 A1    Dec. 8, 2005

(30) Foreign Application Priority Data

Feb. 13, 2004    (DE) ........................ 10 2004 007 172

(51) Int. Cl.
  *H03L 7/06*    (2006.01)
  *H04L 7/00*    (2006.01)
(52) U.S. Cl. ........................... 375/371; 327/158
(58) Field of Classification Search ............... 375/371
  See application file for complete search history.

(56) References Cited

U.S. PATENT DOCUMENTS

| | | | |
|---|---|---|---|
| 6,002,279 A | 12/1999 | Evans et al. ................. 327/144 |
| 6,636,573 B2 * | 10/2003 | Richards et al. ............. 375/355 |
| 6,961,861 B2 * | 11/2005 | Koltzoff et al. ............. 713/400 |
| 2003/0052718 A1 | 3/2003 | Takai ........................ 327/158 |
| 2003/0117191 A1 | 6/2003 | Kwak ........................ 327/158 |
| 2003/0185327 A1 * | 10/2003 | Chen ........................ 375/371 |
| 2006/0188051 A1 * | 8/2006 | Donnelly et al. ............ 375/371 |

FOREIGN PATENT DOCUMENTS

EP    1 229 646 A2    8/2002

\* cited by examiner

*Primary Examiner*—Shuwang Liu
*Assistant Examiner*—David Huang
(74) *Attorney, Agent, or Firm*—William B. Kempler; W. James Brady, III; Frederick J. Telecky, Jr.

(57) ABSTRACT

An integrated phase adjusting circuit (12) for the generation of a clock output signal ($CLK_{out}$) with a phase intermediate the phases of first and second input signals of equal frequency with a fixed phase shift between said first and second signals is proposed. The circuit has an interpolator unit (30) which determines the phase of the clock signal relative to either one of the first input signal and the second input signal, and is controlled externally by a control signal ($PH_{fine}$) to execute a phase step if the phase of the clock signal is to be shifted. The circuit (12) comprises a synchronization unit (40) which synchronizes the phase step with the clock output signal generated by the circuit.

6 Claims, 7 Drawing Sheets

PHASE ADJUSTING CIRCUIT FOR MINIMIZED IRREGULARITIES AT PHASE STEPS

FIELD OF INVENTION

The present invention relates to an integrated phase adjusting circuit for the generation of a clock output signal with a phase intermediate the phases of first and second input signals of equal frequency with a fixed phase shift between said first and second signals.

BACKGROUND OF THE INVENTION

Such circuits are commonly used with voltage controlled oscillators (VCO) in phase locked loops (PLL). The circuit comprises an interpolator unit which receives two input signals of similar phase and frequency but slightly different in phase from the VCO and outputs the desired clock signal with a phase interpolated between the phase of the first input signal and the second input signal. The design and function of this interpolator is known in the art for example from DE 100 28 603. The interpolator is controlled externally to determine the phase of the clock signal relative to either one of the first input signal or the second input signal. To change the phase of the clock output signal, a phase step has to be executed. This phase step is executed by the interpolator unit shifting the phase of the clock signal closer to the phase of either the first or the second input signal when it receives a phase step command. When the phase step is executed, the following crosspoint between the complementary output signals is shifted, which means that one period of the clock signal is extended in duration. Capacitive coupling through switches within the interpolator can cause an additional shift of the following crosspoint. As a result, the extended period is prolonged further and the following period is shortened by the same amount. This unintended effect will appear as phase jitter in the generated clock signal.

SUMMARY OF THE INVENTION

A general object of the present invention is an integrated phase adjusting circuit for the generation of a clock output signal with minimized irregularities at phase steps.

This and other objects and features are provided, in accordance with one aspect of the invention by a phase adjusting circuit for the generation of a clock output signal with a phase intermediate the phases of first and second input signals of equal frequency with a fixed phase shift between said first and second signals is provided. The circuit has an interpolator unit which determines the phase of the clock signal relative to either one of the first input signal and the second input signal. The interpolator unit is controlled externally by a control signal to execute a phase step when the phase of the clock signal is to be shifted. The circuit comprises a synchronization unit which synchronizes the phase step with the clock output signal generated by the circuit. It has been found that the effect of the unwanted coupling which additionally prolongs the period preceding the phase step is strongly dependent on the relative phase when the phase step is executed. By synchronizing the phase step with the phase of the output clock signal, a shortened period after the phase step can be avoided and, thus, additional phase jitter in the output clock signal is avoided.

In accordance with another aspect of the invention, the synchronization unit comprises a command input for receiving a phase step command, a detector for detecting when the phase of the clock output signal is within a phase window in which a phase step can be executed without adding phase jitter to the clock output signal, and a latch for forwarding the phase step command to the interpolator when the phase of the clock output signal is within said phase window. The synchronization unit receives a phase step command and stores it until it detects that the output clock signal is within the aforementioned phase window.

Further features and advantages of the invention will become apparent from the following detailed description with reference to the drawings.

DETAILED DESCRIPTION

Figure 1:
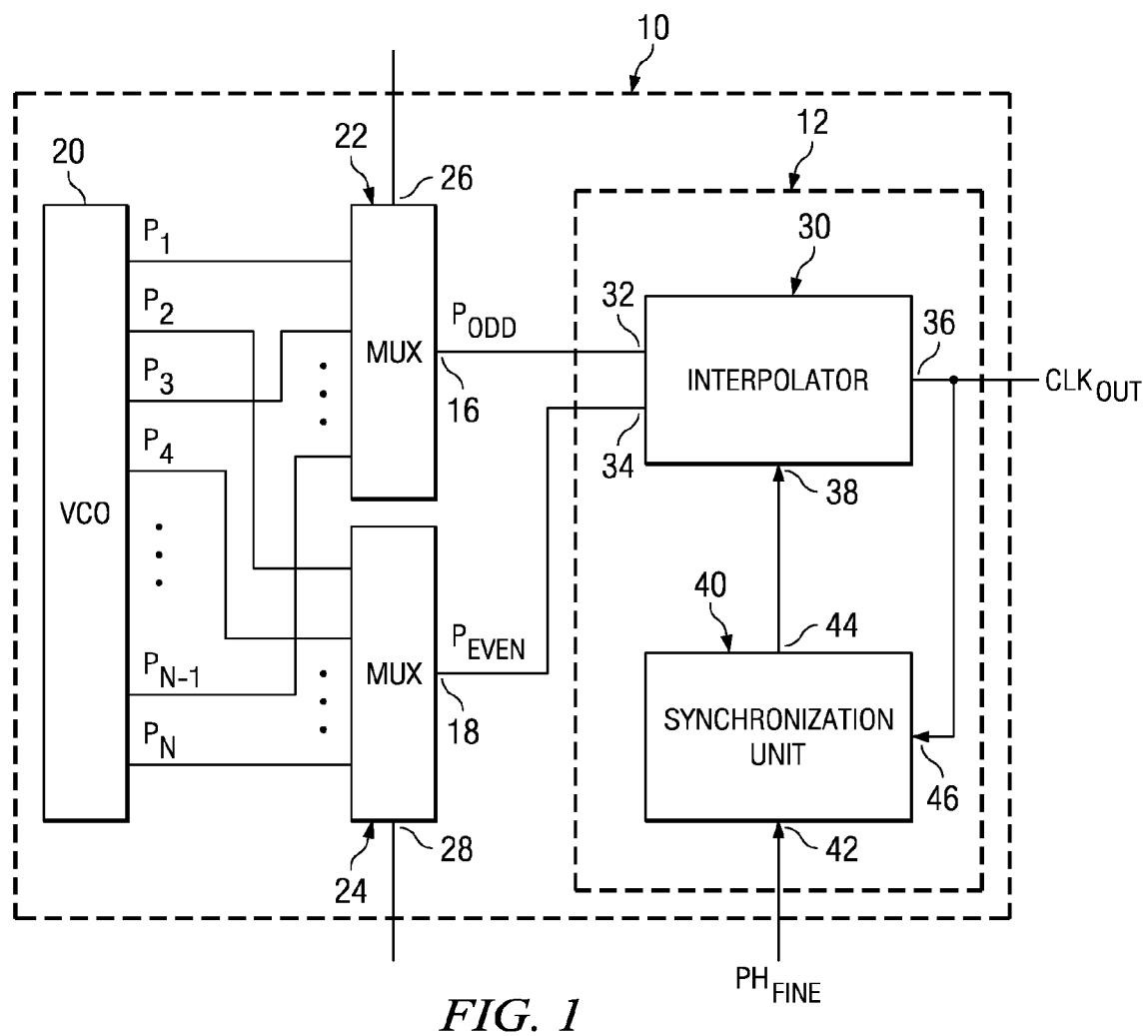
FIG. 1 is a block diagram illustrating the basic structure of a clock signal generator using a phase adjusting circuit according to the invention.

The block diagram in FIG. 1 shows a clock signal generator 10 with a phase adjusting circuit 12 according to the invention, with an oscillator 20 and two multiplexers 22 and 24. The clock signal generator 10 generates a clock output signal $CLK_{out}$ that can be used in circuit configurations which require a signal with a shiftable phase, e.g. a phase locked loop (PLL).

The oscillator 20 is a voltage controlled oscillator (VCO), preferably a ring oscillator, and provides a plurality of similar signals $\phi_1$ to $\phi_n$ at the same frequency but with a fixed phase shift between signals $\phi_m$ and $\phi_{m+1}$, wherein $1 \leq m \leq n$. The phase shift corresponds exactly to the propagation time $\tau_{delay}$ for a high/low transition of one oscillator stage. As such a transition of the signal has to pass through all n stages of the ring oscillator and two transitions make one period, the time between two neighboring phases is:

$$\tau_{delay} = 360°/2\,n.$$

Figure 2:
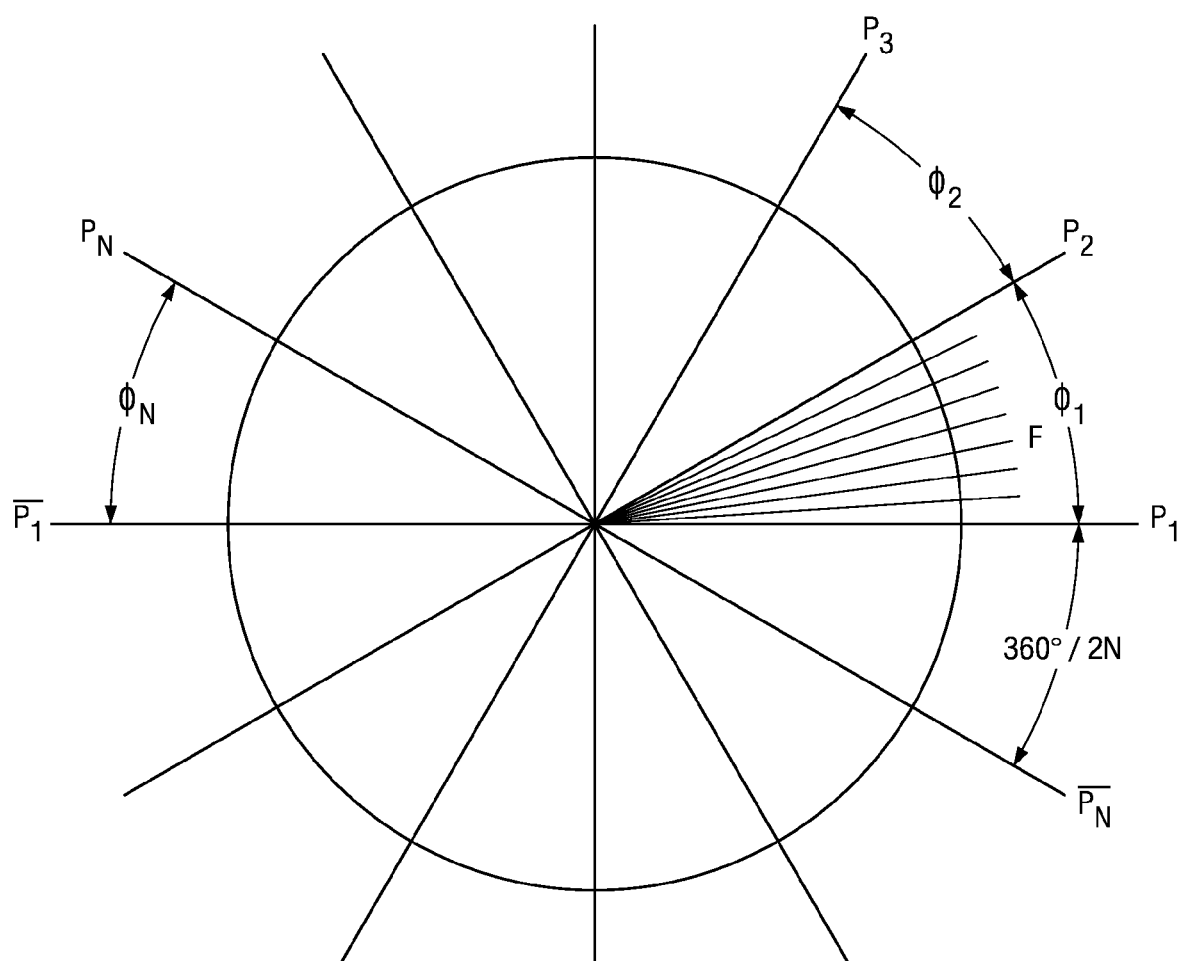
FIG. 2 is a diagram illustrating the phases of the signals generated by the VCO of FIG. 1.

FIG. 2 is a phase diagram that illustrates exemplary of the VCO signals $\phi_1$ to $\phi_n$. The phases of the n VCO signals $\phi_1$ to $\phi_n$ and their inverted equivalents $\phi_1^{-1}$ to $\phi_n^{-1}$ divide one period into 2n sectors $\phi 1$ to $\phi 2n$.

The VCO outputs providing the VCO signals $\phi_1$ to $\phi_n$ are connected to the multiplexers 22, 24. The VCO outputs providing the signals $\phi_1, \phi_3 \ldots$ with odd phases are connected to the first multiplexer, which in the following will be referred to as the odd multiplexer 22, and those VCO outputs providing the signals $\phi_2, \phi_4 \ldots$ with even phases are connected to the second multiplexer which in the following will be referred to as the even multiplexer 24.

The odd multiplexer 22 has a signal output 16 and a control input 26. The even multiplexer 24 has a signal output 18 and a control input 28. Both multiplexers 22, 24 are externally controlled by a control unit (not shown) for selecting two signals with neighboring phases, e.g. $\phi_2$ and $\phi_3$ or $\phi_3$ and $\phi_4$. The selected signals are provided at the outputs 16, 18 of the multiplexers 22, 24. In the following, the signal provided at the output 16 of the odd multiplexer 22 will be referred to as odd signal $\phi_{odd}$ and the signal provided at the output 18 of the even multiplexer 24 will be referred to as even signal $\phi_{even}$. By picking the signals $\phi_{odd}$ and $\phi_{even}$, out of the plurality of signals $\phi_1$ to $\phi_n$, one of the sectors S1 to S2n (c.f. FIG. 2) for the clock output signal $CLK_{out}$ has been selected. So, this selection is a coarse tuning for the phase of the clock output signal $CLK_{out}$.

The fine tuning of the phase of the clock output signal $CLK_{out}$ within this selected sector is done in the phase adjusting circuit 12 which will be described in detail in the following.

The phase adjusting circuit 12 comprises an interpolator unit 30 and a synchronization unit 40. The interpolator unit 30 interpolates from the two input signals $\phi_{odd}$ and $\phi_{even}$ the clock output signal with a phase intermediate the phases of the first input signal $\phi_{odd}$ and the second input signal $\phi_{even}$. The interpolator unit 30 has a first input 32 for receiving a first input signal $\phi_{odd}$ from the odd multiplexer 22, a second input 34 for receiving a second input signal $\phi_{even}$ from the even multiplexer 24, a signal output 36 to provide the clock output signal $CLK_{out}$ and a control input 38.

Figure 3:
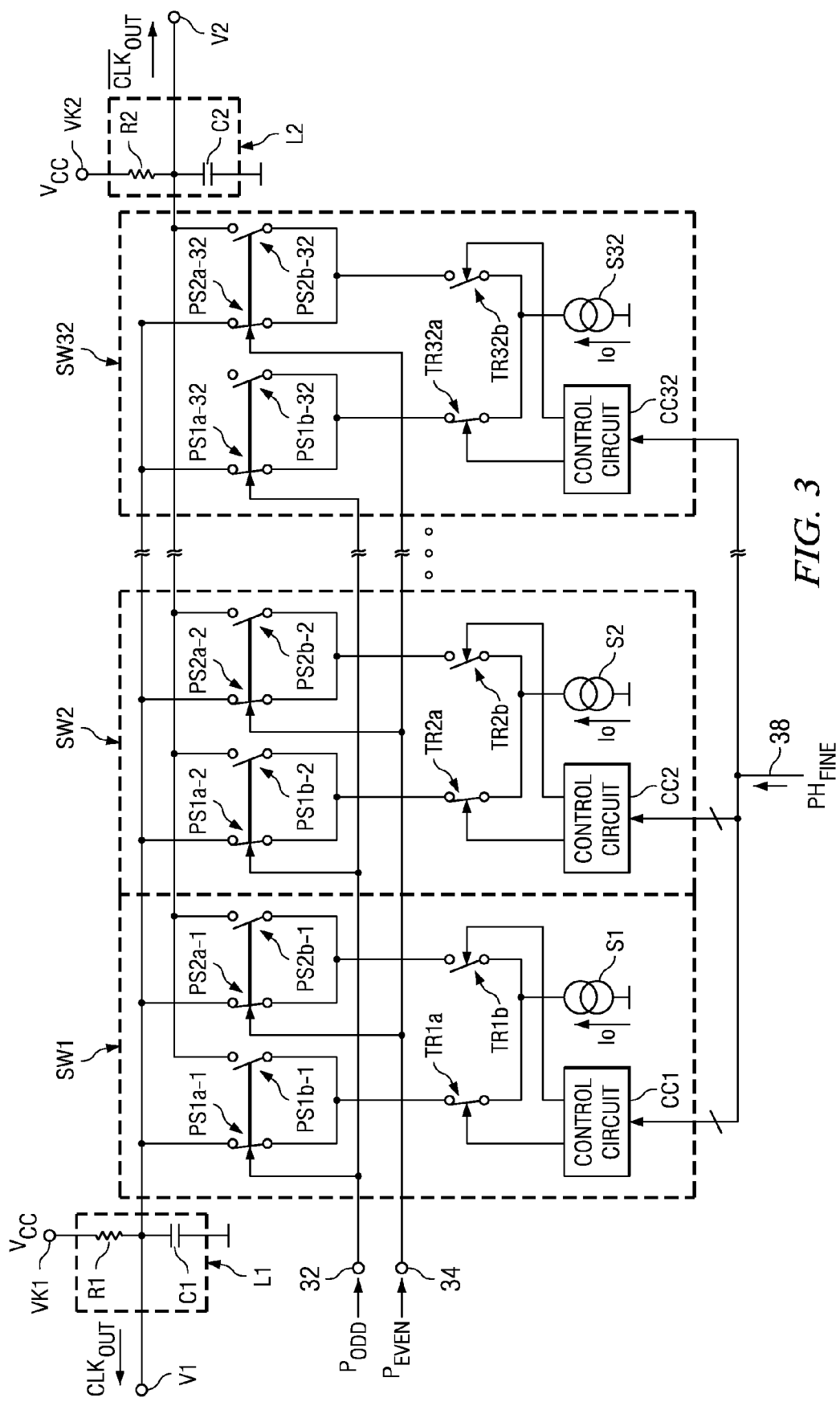
FIG. 3 is a schematic of the interpolator of FIG. 1.

Referring now to FIG. 3, there is shown a schematic of the interpolator 30. The design of an interpolator is known in the state of the art, e.g. from DE 100 28 603. Therefore, the description of the design and function of the interpolator 30 will be restricted to those details needed for comprehension of the invention.

The interpolator 30 comprises a first charging circuit $L_1$, having a capacitor $C_1$ and a resistor $R_1$. The capacitor $C_1$ of the charging circuit $L_1$ can be charged and discharged, thus the voltage of the capacitor $C_1$ which defines the clock output signal $CLK_{out}$ will oscillate. A second charging circuit $L_2$ having a capacitor $C_2$ and a resistor $R_2$ is provided which operates inverse to the first charging circuit $L_1$. Therefore, the interpolator 30 can provide a differential clock output signal $CLK_{out}$. This is advantageous for use with various applications requiring differential clock signals.

The interpolator 30 further comprises a set of switching stages SW1-SW32 which are configured identically. The structure of these switching stages SW1-SW32 is described in detail in the following by example of the first switching stage SW1.

The first switching stage SW1 comprises a current source S1 providing a current $I_0$ for charging the capacitors C1, C2, a first current switch TR1a, a second current switch TR1b, and a control circuit CC1 for controlling the current switches TR1a and TR1b.

The first switching stage SW1 further comprises a first switch couple PS1a-1, PS1b-1, controlled by the first input signal $\phi_{odd}$, and a second switch couple PS2a-1, PS2b-1, controlled by the second input signal $\phi_{even}$. The first switch couple PS1a-1, PS1b-1 is connected to the first current switch TR1a and can connect the current source S1 to either the first charging circuit $L_1$ or the second charging circuit $L_2$. Similarly, the second switch couple PS2a-1, PS2b-1 is connected to the second current switch TR1b and can connect the current source S1 to either the first charging circuit $L_1$ or the second charging circuit $L_2$.

In the figures, the reference signs of the components of the switching stages SW1-SW32 are indexed by numbers 1 to 32. So, switch couples PS1a-2, PS1b-2 and PS2a-2, PS2b-2, switches TR2a, TR2b and control circuit CC2 belong to switching stage SW2, switch couples PS1a-3, PS1b-3 and PS2a-3, PS2b-3, switches TR3a, TR3b and control circuit CC3 belong to switching stage SW3, etc.

The first switch couples PS1a-1, PS1b-1 to PS1a-32, PS1b-32 are assigned to a switch set which is controlled by the first input signal $\phi_{odd}$ and in the following will be referred to as PS1. The second switch couples PS2a-1, PS2b-1 to PS2a-32, PS2b-32 are assigned to a switch set which is controlled by the second input signal $\phi_{even}$ and in the following will be referred to as PS2. For simplicity, also the other components of the switching stages SW1-SW32 will in the following be referenced without the indexing numbers.

The number of the switching stages SW1-SW32 in this embodiment is 32, and represents the number of steps f, the phase of the clock output signal can be shifted within one sector between the phase of the first input signal $\phi_{odd}$ and the second input signal $\phi_{even}$ (see FIG. 2). But any other number may be implemented, depending on the desired number of steps.

The current switches TR1 to TR32 are controlled by control circuits CC1 to CC32, for selectively connecting each of the current sources to either the first or the second set of phase switches. So, by selecting the number of current sources S which are connected to the first set of phase switches PS1 and to the second set of phase switches PS2, the current charging the Capacitors $C_1$, $C_2$ can be controlled, and thus the phase of the clock output signal $CLK_{out}$ can be determined to be closer to the phase of the first input signal $\phi_{odd}$ or the second input signal $\phi_{even}$.

To determine the fine tuning of the phase of the clock output signal $CLK_{out}$, the interpolator 30 is controlled externally by a control signal $PH_{fine}$, which is received through the control input 38 and may be a digital code for example. The interpolator does this fine tuning by performing a phase shift, which means, that it executes a phase step when it receives the respective command through the control input 38.

If a phase step command is to be executed, one of the current sources S is switched from the first set of phase switches PS1 to the second set of phase switches PS2 or vice versa, by one of the control circuits CC changing the status of its assigned current switches TRa and TRb.

Figure 4:
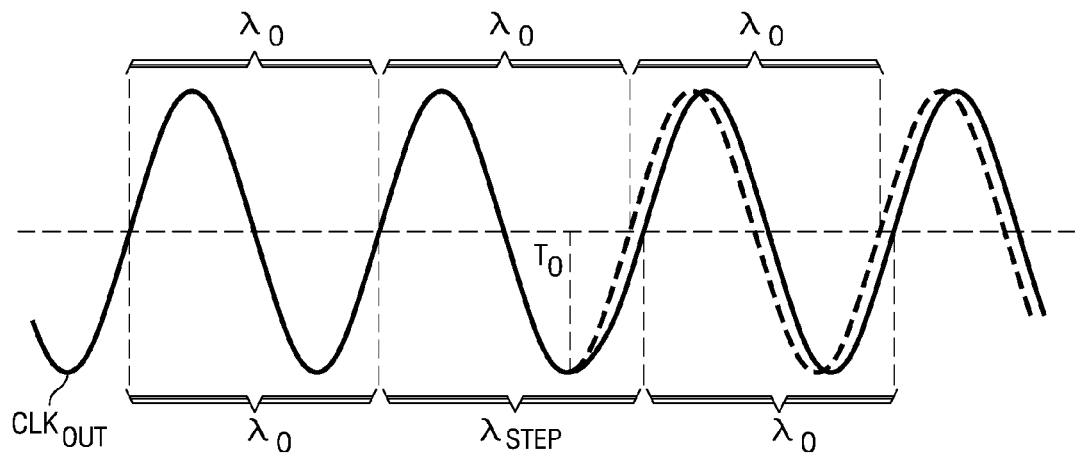
FIG. 4 is a diagram illustrating a clock output signal generated by a circuit from the state of the art.

The diagram of FIG. 4 shows a theoretical output signal $CLK_{out}$ with a basic period $\lambda_0$ when such a phase step is performed. For reasons of simplified illustration, the signal is drawn single ended only. The phase step is executed at $t=t_0$. As a result, one period $\lambda_0$ of the clock output signal $CLK_{out}$ is extended to a period $\lambda_{step}$. To illustrate the resulting phase shift, the signal as it would have been without the phase step is drawn in dotted line.

Figure 5:
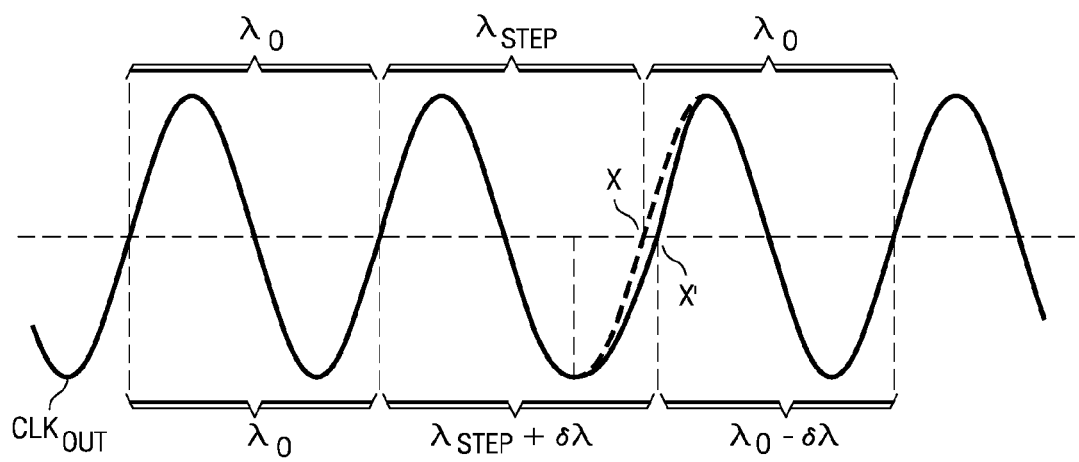
FIG. 5 is a diagram illustrating another clock output signal generated by a circuit from the state of the art.

In the interpolator known from the state of art, the extended period $\lambda_{step}$ suffers an additional cross point shifting. This additional crosspoint shifting is due to coupling effects in the switching transistors of the interpolator, which influence the charging current for the capacitors $C_1$, $C_2$, thus changing the steepness of subsequent rising or falling edges of the signal. The results of this phenomenon are illustrated in the diagram of FIG. 5.

A phase step is assumed to be executed at $t=t_0$. Without a coupling effect, the crosspoint X following the phase step will be shifted resulting in the clock output signal $CLK_{out}$ showing one extended period $\lambda_{step}$ (broken line). Due to the coupling mentioned above, the crosspoint X is additionally shifted by an amount $\delta\lambda$. This amount can have a positive or a negative sign. As a result, the extended period $\lambda_{step}$ is additionally prolonged by the amount $\delta\lambda$ and the following period is shortened by the same amount. This unintended prolonging and shortening of the extended period $\lambda_{step}$ and the following period in the clock output signal $CLK_{out}$ causes additional phase jitter in the output signal.

The applicant has found that the influence of the coupling effect on variations in the period of the clock output signal $CLK_{out}$ is strongly dependent on the phase relationship when the phase step is executed. This is illustrated in FIGS. 6 and 7.

Figure 6:
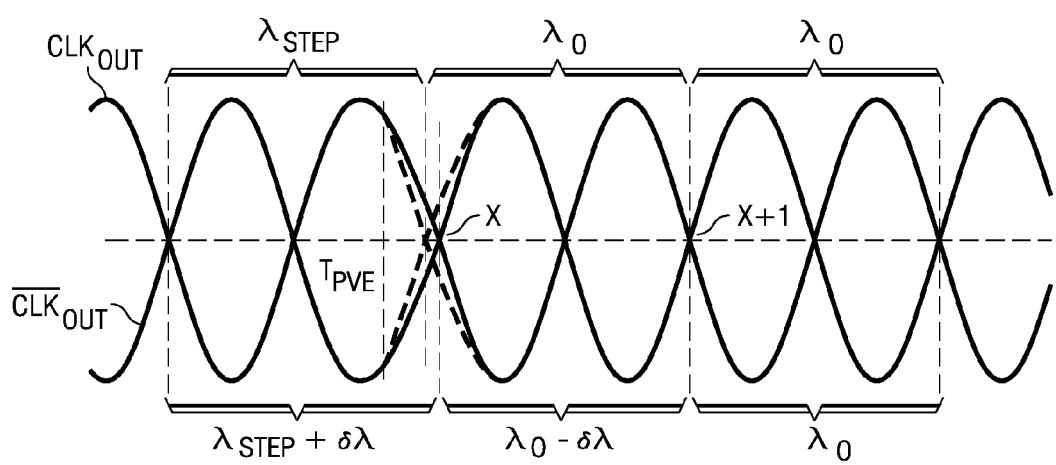
FIG. 6 is a diagram illustrating yet another clock output signal generated by a circuit from the state of the art.

FIG. 6 shows the differential clock output signal $CLK_{out}$ with a phase step executed at $t=t_{pre}$, less than 90° before a crosspoint X of the signal. Additional cross point shifting is produced through coupling, resulting in an additionally prolonged period $\lambda_{step}+\delta\lambda$ followed by a shortened period $\lambda_0-\delta\lambda$. Shown in dashed lines is the theoretical signal as it would have been without coupling effect.

Figure 7:
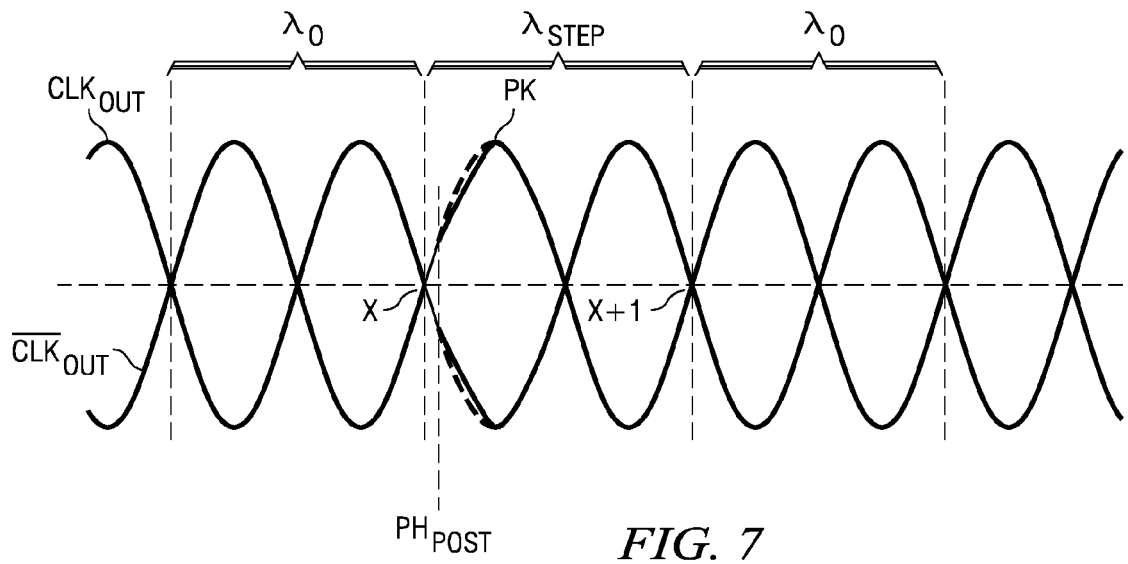
FIG. 7 is a diagram illustrating a clock signal generated by a circuit according to the present invention.

FIG. 7 shows the differential clock output signal $CLK_{out}$ when the phase step is executed at $t=t_{post}$ after a crosspoint X. In this case, the capacitive coupling has no influence on the period $\lambda_{step}$. The next crosspoint $X_{+1}$ is shifted by the desired amount, but no additional cross point shifting $\delta\lambda$ occurs. The only effect of the coupling is that the rising edge of the signal $CLK_{out}$ reaches its peak pk following the phase step at $t=t_{post}$ a little bit later. However, this does not shift the crosspoint $X_{+1}$ because after the peak pk, the signal is determined by the first input signal $\phi_{odd}$ and the second input signal $\phi_{even}$ only, just like it was prior to the phase step. Then, the extended period $\lambda_{step}$ is followed by original periods $\lambda_0$.

Figure 8:
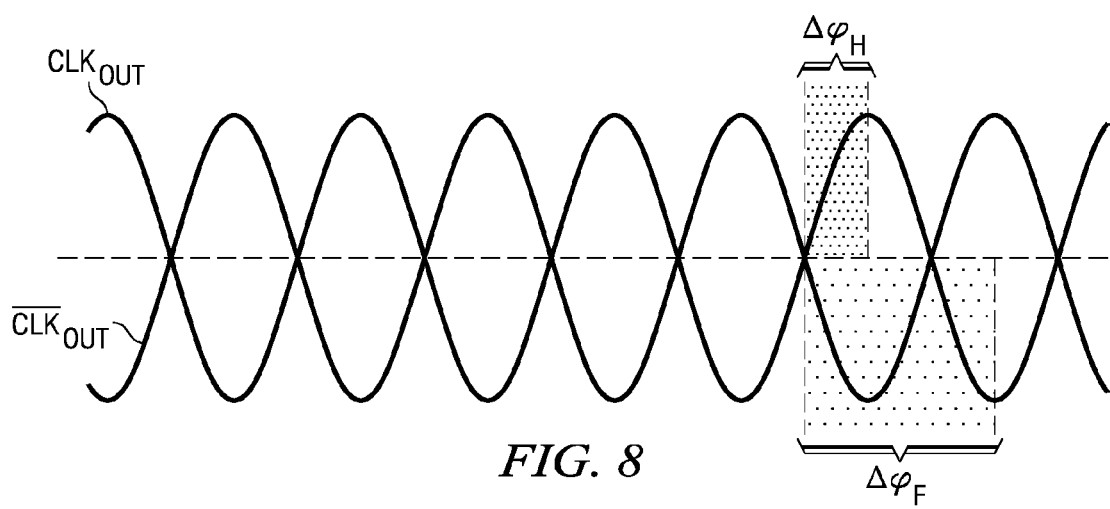
FIG. 8 is a diagram illustrating phase windows for executing a phase step.

Thus, a phase window $\Delta\phi$ can be defined where a phase step can be executed without causing additional irregularities. The width of this phase window $\Delta\phi$ depends on the application that uses the clock output signal $CLK_{out}$. If only full periods are considered, the window has a width of $\Delta\phi_h<270°$. If half periods are considered also, the window width is roughly a quarter of a period or $\Delta\phi_f<90°$. Both cases are illustrated in the diagram of FIG. 8.

In order to provide a clock output signal $CLK_{out}$ with minimized irregularities, the phase adjusting circuit 12 according to the invention comprises a synchronization unit 40 with a control input 42 for receiving the external control signal $PH_{fine}$ designated for the interpolator 30, a control output 44 which is connected to the control input 38 of the interpolator 30 for forwarding the external control signal $PH_{fine}$ to the interpolator 30, and a feedback input 46 which is connected to the signal output 36 of the interpolator 30.

When the synchronization unit 40 receives an external phase step command in the control signal $PH_{fine}$, it will store this command for forwarding it to the command input 38 of the interpolator 30 just at the right moment in order to synchronize the execution of the phase step command with the clock output signal $CLK_{out}$. To find this right moment, the clock output signal $CLK_{out}$ is branched off into the feedback input 46 of the synchronization unit 40, allowing the synchronization unit 40 to detect when the clock output signal $CLK_{out}$ is within the phase window $\Delta\phi$.

Figure 9:
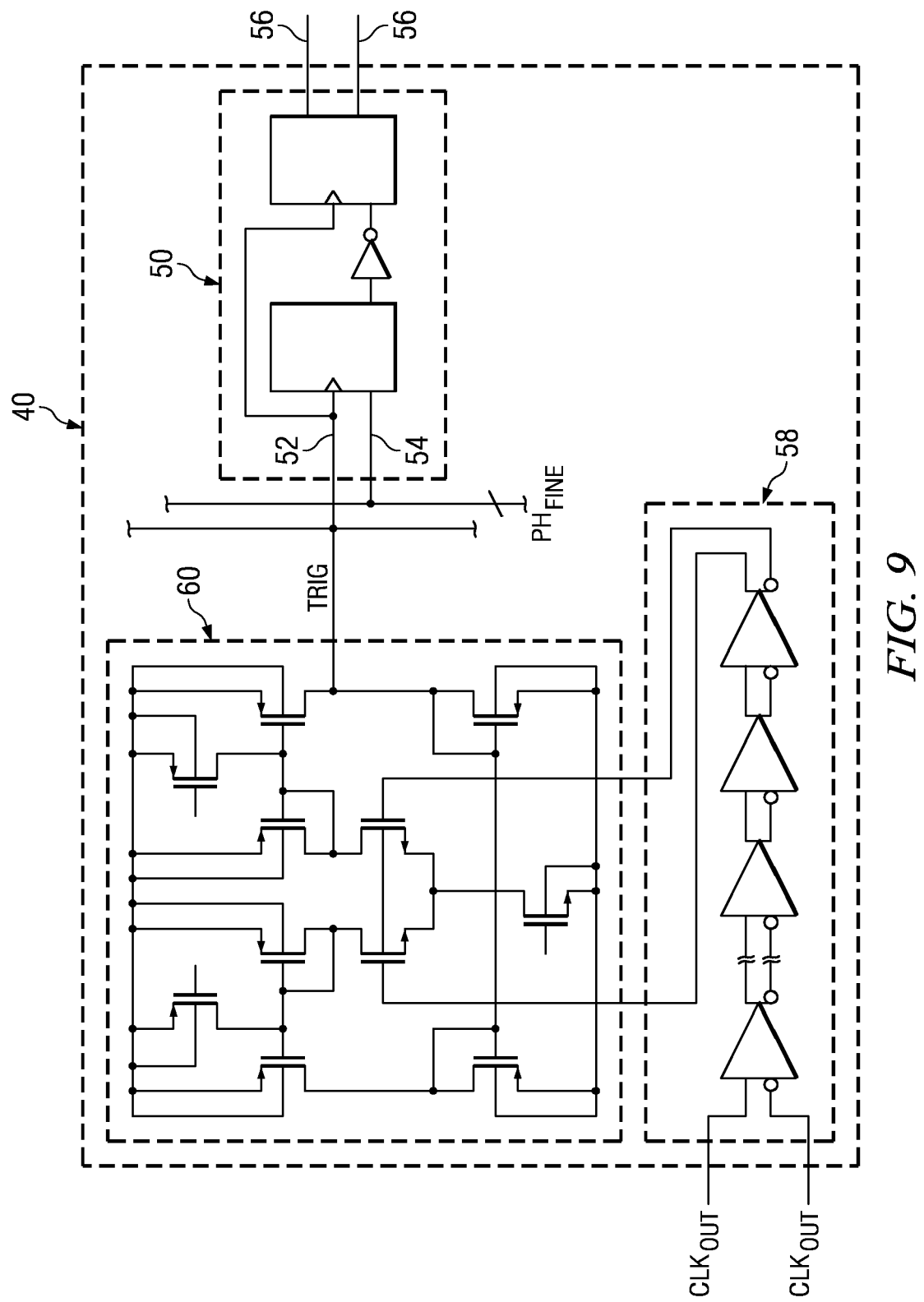
FIG. 9 is a schematic of a phase adjusting circuit according to a first embodiment of the present invention.

Referring now to FIG. 9, there is shown a schematic of a synchronization unit 40 for use in a phase adjusting circuit 12 according to a first embodiment of the invention.

The synchronization unit 40 comprises a conversion stage 60 for converting the differential clock output signal $CLK_{out}$ into a single ended trigger signal TRIG. Preferably, the conversion stage 60 is similar to an oscillator stage of the VCO and is therefore process, temperature, voltage and frequency compensated.

The synchronization unit 40 further comprises a latch constituted by one double flip-flop 50 for each of the control circuits CC1 to CC32. The double flip-flop 50 has a data input 54, a trigger input 52 and an output 56 connected to the associated control circuit. The double flip-flop 50 is clocked by the trigger signal TRIG. If a phase step command from the control signal $PH_{fine}$ has to be executed, the data input 54 of the respective latch is preloaded. Then, at the output 56 the phase step command is forwarded to the assigned control circuit CC of the interpolator 30 when the double flip-flop is triggered. This means that the phase step command is latched with the trigger signal TRIG and thus synchronized with the clock output signal $CLK_{OUT}$.

Considering the propagation time for a signal throughout the interpolator 30 and the synchronization unit 40, in this embodiment, the phase step is executed after $$T_{pd\ total} = \frac{1}{4(T_{pd\ conversion} + T_{pd\ FF} + T_{pd\ int})}$$

where $T_{pdconversion}$ is the propagation time for the conversion of the clock output signal $CLK_{out}$ into a single-ended signal, $T_{pdFF}$ is the propagation time through the double flip-flop 50 from the clock input 52 to the output 56 and $T_{pdInt}$ is the propagation time within the interpolator 30 from the command input 38 to the output 36.

It can be found that $T_{pdtotal}$ may be longer than the a quarter of a period of the clock output signal $CLK_{out}$. In this case, the phase step would be executed outside the acceptable phase window $\Delta\phi$.

To avoid this, the synchronization unit 40 comprises a delay circuit 58 for delaying the branched-off clock output signal $CLK_{out}$ before it is converted within the conversion unit 60. So, the trigger signal TRIG for the double flip-flop 50 is delayed to the next phase window $\Delta\phi$ in the following period of the clock output signal $CLK_{out}$. Preferably, the stages of the delay circuit 58 are copies of the VCO stages and are therefore process, temperature, voltage and frequency compensated.

To remain within the acceptable phase window $\Delta\phi$, the variation of $T_{pdtotal}$ has to be smaller than a quarter of a period of the clock output signal. Since the propagation time through the double flip-flop $T_{pdFF}$ and the propagation time within the interpolator $T_{pdInt}$ are not process-, temperature voltage and frequency compensated, the first embodiment can be used up to a maximum frequency of $$f_{max} = \frac{1}{4(\Delta T_{pd\ FF} + \Delta T_{pd\ int})},$$

with $\Delta T_{pdFF}$ being the variation of propagation time through the double flip-flop and $\Delta T_{pdInt}$ being the variation of propagation time through the integrator.

Figure 10:
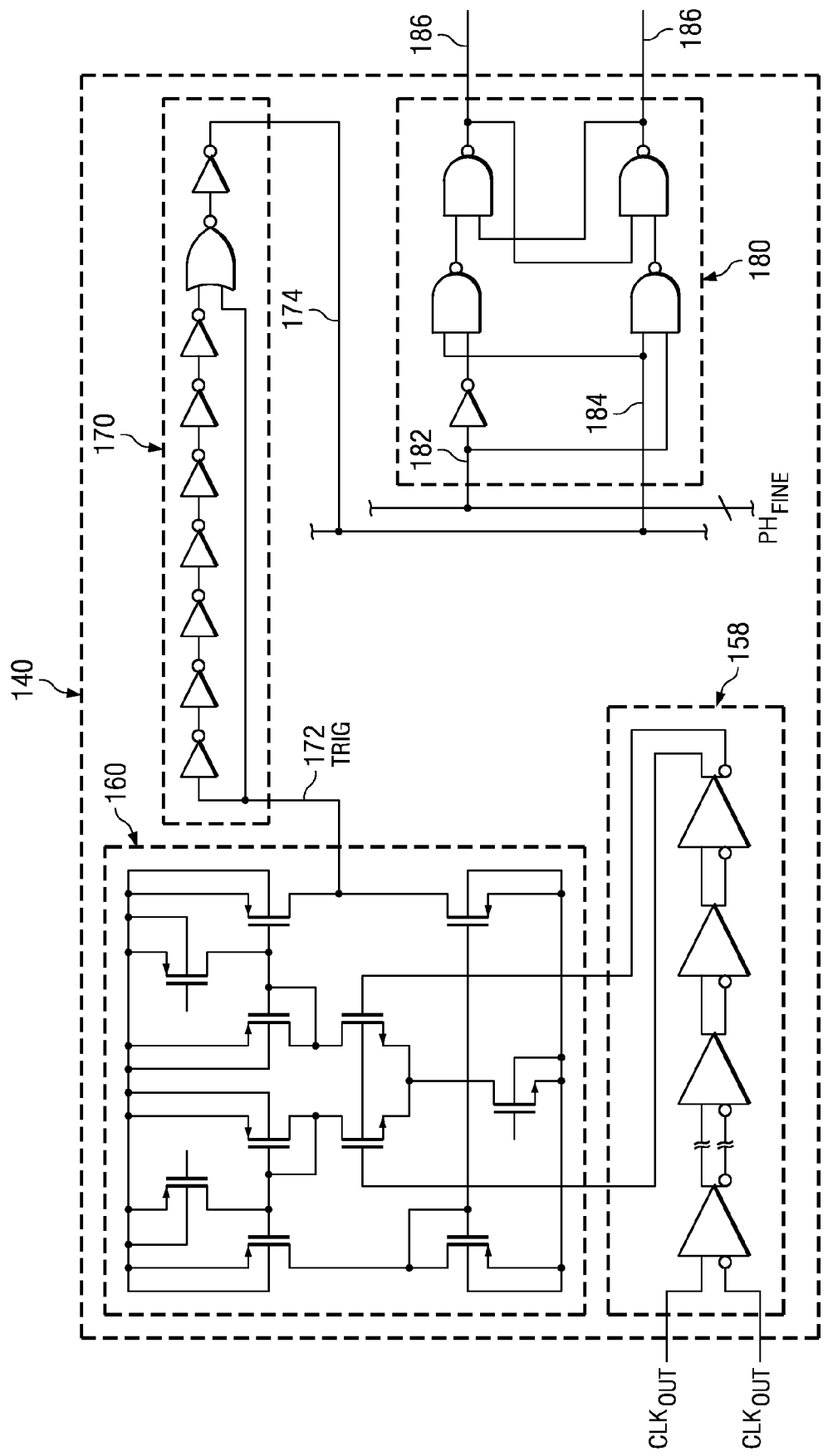
FIG. 10 is a schematic of a phase adjusting circuit according to a second embodiment of the invention.

Referring now to FIG. 10, there is shown a schematic of a synchronization unit 140 for a phase adjusting circuit according to a second embodiment of the invention. For components already used in the first embodiment, reference numbers augmented by 100 are used. The phase adjusting circuit of this embodiment uses an interpolator similar to the one described in the first embodiment.

The synchronization unit 140 comprises a conversion stage 160 for conversion of the differential clock output signal $CLK_{out}$ into a single ended trigger signal TRIG. Preferably, the conversion stage 160 is similar to an oscillator stage of the VCO and is therefore process, temperature, voltage and frequency compensated. Also, for the reasons given above, a delay circuit 158 is included.

The synchronization unit 140 further comprises a monoflop 170 having an input 172 and an output 174. The output of the conversion stage 160 is connected to the input 172 of the monoflop 170. The monoflop 170 transforms a positive edge of the trigger signal TRIG into a high potential provided at the output 174.

The synchronization unit 140 also includes a latch constituted by a set of similar D-flip-flops 180, one of them being illustrated in FIG. 10. The D-flip-flop 180 has a data input 182, a trigger input 184, connected to the output 174 of the monoflop 170, and a differential output 186, 188 for controlling the current switches TR of the assigned switching stage SW within the interpolator. So, the D-flip-flop 180 likewise constitutes a control circuit for the switch TR and is preferably integrated into the interpolator, i.e. into the control circuit CC. The data input 182 of the D-flip-flop 180 is provided with the external phase step command in the control signal $PH_{fine}$.

The double flip-flop 180 is clocked by the trigger signal TRIG. If a phase step command from the control signal $PH_{fine}$ has to be executed, the data input 182 of the respective latch is preloaded. When the double flip-flop 180 is triggered by the conditioned trigger signal TRIG from the monoflop 170, it acts as control circuit CC and toggles the associated switch TR TR of the interpolator 30. This means that the phase step command is latched with the trigger signal TRIG and thus synchronized with the clock output signal $CLK_{out}$.

This embodiment can be used up to a maximum frequency of $$f_{max} = \frac{1}{4(\Delta T_{pd\ NOR/INV} + \Delta T_{pd\ int})}.$$

where $\Delta T_{pdNOR/INV}$ is the variation in propagation time through the NOR-Gates and the inverter and $\Delta T_{pdInt}$ is the variation in propagation time through the integrator.

This maximum frequency is considerably higher than the maximum frequency of the first embodiment, because the variation in the double flip-flop propagation time $T_{pdFF}$ of the first embodiment is at least two to three times higher than the variation in propagation time $T_{pdNOR/INV}$ through the NOR-Gates and the inverter.

Further, the power consumption of the second embodiment is much lower, since the monoflop 170 has to be implemented only one time whereas the double flip-flop 50 in the first embodiment must be implemented for every switch stage in the interpolator.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A phase adjusting circuit (12) for the generation of a clock output signal ($CLK_{out}$) with a phase intermediate the phases of first and second input signals of equal frequency with a fixed phase shift between said first and second signals, said circuit having an interpolator unit (30) which determines the phase of the clock signal relative to either one of the first input signal and the second input signal, the interpolator unit being controlled externally by a control signal ($PH_{fine}$) to execute a phase step when the phase of the clock output signal is to be shifted, wherein the phase adjusting circuit (12) comprises a synchronization unit (40) which synchronizes the phase step with the clock output signal, wherein the synchronization unit (40) comprises a command input (42) for receiving a phase step command, a detector for detecting when the phase of the clock output signal is within a phase window ($\Delta\phi$) in which a phase step can be executed without adding phase jitter to the clock output signal, and a latch (50) for forwarding the phase step command to the interpolator when the phase of the clock output signal is within said phase window.

2. The circuit of claim 1 wherein the phase window is one quarter of the output clock signal period.

3. A phase adjusting circuit (12) for the generation of a clock output signal ($CLK_{out}$) with a phase intermediate the phases of first and second input signals of equal frequency with a fixed phase shift between said first and second signals, said circuit having an interpolator unit (30) which determines the phase of the clock signal relative to either one of the first input signal and the second input signal, the interpolator unit being controlled externally by a control signal ($PH_{fine}$) to execute a phase step when the phase of the clock output signal is to be shifted, wherein the phase adjusting circuit (12) comprises a synchronization unit (40) which synchronizes the phase step with the clock output signal, wherein the synchronization unit (40) comprises a command input (42) for receiving a phase step command, a detector for detecting when the phase of the clock output signal is within a phase window ($\Delta\phi$) in which a phase step can be executed without adding phase jitter to the clock output signal, and a latch (50) for forwarding the phase step command to the interpolator when the phase of the clock output signal is within said phase window, and wherein said interpolator comprises:

a set of current sources (S1, . . . S32), each of which being coupled to at least one of a first set of phase switches (PS1*a*-1, PS1*b*-1;. . . PS1*a*-32, PS1-*b*32) controlled by said first input signal, and one of a second set of phase switches (PS2*a*-1, PS2*b*-1; . . . PS2*a*-32, PS2-*b*32) controlled by said second input signal;

a charging circuit (L1, L2) in which a charging voltage of a capacitor (C1, C2) which defines said clock output signal ($CLK_{out}$) is varied by switching said current sources (S, . . . S32) on or off in accordance with the closing or opening of the phase switches (PS1*a*-1 . . . PS1*a*-32; PS1*b*-1 . . . PS1-*b*32; PS2*a*-1 . . . PS2*a*-32; PS2*b*-1 . . . PS2-*b*32);

a set of current switches (TR1*a*, TR1*b*, . . . TR32*a*, TR32*b*) coupled to said current sources (S1, . . . S32) for selectively connecting each of said current sources to either said first or second set of phase switches (PS1*a*-1 . . . PS1*a*-32; PS1*b*-1 . . . PS1-*b*32;

PS2*a*-1 ... PS2*a*-32; PS2*b*-1 ... PS2-*b*32) for determining the phase of the clock output signal relative to either one of the first and second input signals by the number of current sources connected to either said first or second set of phase switches (PS1*a*-1 ... PS1*a*-32; PS1*b*-1 ... PS1-*b*32; PS2*a*-1 ... PS2*a*-32; PS2*b*-1 ... PS2-*b*32); each of said current switches (TR1*a*, TR1*b*, ... TR32*a*, TR32*b*) being coupled to a control circuit (CC1, ... CC32) for controlling the current switches in accordance with an external control signal (PH$_{fine}$) and for executing a phase step by changing the number of current sources (S1, ... S32) connected to either said first or second set of phase switches (PS1*a*-1 ... PS1*a*-32; PS1*b*-1 ... PS1-*b*32; PS2*a*-1 ... PS2*a*-32; PS2*b*-1 ... PS2-*b*32);

and wherein said detector comprises a converter (60) for converting the clock output signal (CLK$_{out}$) into a trigger signal (TRIG) for synchronization of the phase step with the clock output signal; and said synchronization unit (140) comprising a set of double Flip-Flops (50) coupled to said control units, each of said double Flip-Flops having a data input (54) which is loaded with said phase step command from said external control signal (PH$_{fine}$), a trigger input (52) triggered by said trigger signal from the detector and an output (56) connected to the control circuit (CC1, ... CC32) to forward the phase step command.

4. The circuit of claim 3 wherein said detector comprises a delay line (58; 158) for delaying said trigger signal (TRIG) to compensate for signal propagation time within the interpolator (30; 130) and/or the synchronization unit (40; 140).

5. A phase adjusting circuit (12) for the generation of a clock output signal (CLK$_{out}$) with a phase intermediate the phases of first and second input signals of equal frequency with a fixed phase shift between said first and second signals, said circuit having an interpolator unit (30) which determines the phase of the clock signal relative to either one of the first input signal and the second input signal, the interpolator unit being controlled externally by a control signal (PH$_{fine}$) to execute a phase step when the phase of the clock output signal is to be shifted, wherein the phase adjusting circuit (12) comprises a synchronization unit (40) which synchronizes the phase step with the clock output signal, wherein the synchronization unit (40) comprises a command input (42) for receiving a phase step command, a detector for detecting when the phase of the clock output signal is within a phase window (Δϕ) in which a phase step can be executed without adding phase jitter to the clock output signal, and a latch (50) for forwarding the phase step command to the interpolator when the phase of the clock output signal is within said phase window, and wherein said interpolator comprises:

a set of current sources (S1, ... S32), each of which being coupled to at least one of a first set of phase switches (PS1*a*-1, PS1*b*-1; ... PS1*a*-32, PS1-*b*32) controlled by said first input signal, and one of a second set of phase switches (PS2*a*-1, PS2*b*-1; ... PS2*a*-32, PS2-*b*32) controlled by said second input signal;

a charging circuit (L1, L2) in which a charging voltage of a capacitor (C1, C2) which defines said clock output signal (CLK$_{out}$) is varied by switching said current sources (S, ... S32) on or off in accordance with the closing or opening of the phase switches (PS1*a*-1 ... PS1*a*-32; PS1*b*-1 ... PS1-*b*32; PS2*a*-1 ... PS2*a*-32; PS2*b*-1 ... PS2-*b*32);

a set of current switches (TR1a, TR1b, ... TR32*a*, TR32*b*) coupled to said current sources (S1, ... S32) for selectively connecting each of said current sources to either said first or second set of phase switches (PS1*a*-1 ... PS1*a*-32; PS1*b*-1 ... PS1-*b*32; PS2*a*-1 ... PS2*a*-32; PS2*b*-1 ... PS2-*b*32) for determining the phase of the clock output signal relative to either one of the first and second input signals by the number of current sources connected to either said first or second set of phase switches (PS1*a*-1 ... PS1*a*-32; PS1*b*-1 ... PS1-*b*32; PS2*a*-1 ... PS2*a*-32; PS2*b*-1 ... PS2-*b*32);

each of said current switches (TR1*a*, TR1*b*, ... TR32*a*, TR32*b*) being coupled to a control circuit (CC1, ... CC32) for controlling the current switches in accordance with an external control signal (PH$_{fine}$) and for executing a phase step by changing the number of current sources (S1, ... S32) connected to either said first or second set of phase switches (PS1*a*-1 ... PS1*a*-32; PS1*b*-1 ... PS1-*b*32; PS2*a*-1 ... PS2*a*-32; PS2*b*-1 ... PS2-*b*32); p1 and wherein said detector comprises a monoflop (170) for converting an edge of the clock output signal (CLK$_{out}$) into a trigger signal (TRIG) for synchronization of the phase step with the clock output signal; and said latch being implemented by a D-Flip-Flop (180) in each of said control units (CC1, ... CC32), said D-Flip-Flop having a data input (182), which is loaded with said phase step command in said external control signal (PH$_{fine}$), a trigger input (184) which is triggered by said trigger signal from the detector, and a differential output (186, 188) for controlling the assigned current switch (TR1*a*, TR1*b*, ... TR32*a*, TR32*b*).

6. The circuit of claim 5 wherein said detector comprises a delay line (58; 158) for delaying said trigger signal (TRIG) to compensate for signal propagation time within the interpolator (30; 130) and/or the synchronization unit (40; 140).

* * * * *